(12) United States Patent
Kawashima et al.

(10) Patent No.: US 6,191,485 B1
(45) Date of Patent: Feb. 20, 2001

(54) SEMICONDUCTOR DEVICE

(75) Inventors: Tomoyuki Kawashima; Kenji Okamoto; Tadayoshi Ishii, all of Kanagawa; Mitsuaki Kirisawa, Nagano; Kazuhiko Imamura, Mie, all of (JP)

(73) Assignee: Fuji Electronic Co., Ltd. (JP)

( * ) Notice: Under 35 U.S.C. 154(b), the term of this patent shall be extended for 0 days.

(21) Appl. No.: 09/395,811

(22) Filed: Sep. 14, 1999

(30) Foreign Application Priority Data

Oct. 8, 1998 (JP) .............................. PA10-286216

(51) Int. Cl.⁷ .................... H01L 23/48; H01L 23/52; H01L 29/40
(52) U.S. Cl. .................. 257/766; 257/771; 257/765
(58) Field of Search .................... 257/766, 771, 257/765, 780, 781

(56) References Cited

U.S. PATENT DOCUMENTS

| | | | |
|---|---|---|---|
| 3,781,596 | * 12/1973 | Galli et al. | 257/766 |
| 3,990,094 | * 11/1976 | Konantz et al. | 257/766 |
| 4,358,784 | * 11/1982 | Wislocky et al. | 257/766 |
| 4,372,809 | * 2/1983 | Grewal et al. | 257/766 |
| 4,378,410 | * 3/1983 | Bailey | 257/766 |
| 5,227,332 | * 7/1993 | Morris | 257/765 |
| 5,408,120 | * 4/1995 | Manabe et al. | 257/766 |
| 6,011,313 | * 1/2000 | Shangguan et al. | 257/765 |

FOREIGN PATENT DOCUMENTS

| | | | |
|---|---|---|---|
| 4-72764 | * 3/1992 | (JP) | 257/766 |
| 4-85972 | * 3/1992 | (JP) | 257/766 |
| 6252091 | 9/1994 | (JP) . | |

* cited by examiner

*Primary Examiner*—Sheila V. Clark
(74) *Attorney, Agent, or Firm*—Rossi & Associates

(57) ABSTRACT

In a semiconductor device having a laminated metal layer in which a metal layer whose main component is aluminum and a metal layer whose main component is nickel are laminated on each other, the ratio ($t_{Al}/t_{Ni}$) of the thickness ($t_{Al}$) of the metal layer whose main component is aluminum to that ($t_{Ni}$) of the metal layer whose main component is nickel is controlled to 5 or larger, so that part of the metal layer whose main component is aluminum remains even if an Al—Ni intermetallic compound is formed.

2 Claims, 3 Drawing Sheets

SEMICONDUCTOR DEVICE

FIELD OF THE INVENTION

The present invention relates to semiconductor devices, and in particular to metal layers, such as electrodes and wires, which are formed on the semiconductor devices.

BACKGROUND OF THE INVENTION

In recent years, electronic equipment in which semiconductor devices are mounted has been used in a wider range of applications, or under severe conditions or environments, such as vibrations, temperature cycles, stresses, and various atmospheres, which require high reliability of the electronic equipment. To keep up with the expansion of the use of electronic equipment, it is extremely important to provide semiconductor devices having sufficiently high reliability. In particular, it has been strongly desired to improve the reliability of connecting portions at which the semiconductor devices and external components or devices are electrically joined to each other. Known methods for electrically connecting the semiconductor devices with the external components include wire bonding, soldering, and pressure welding, for example.

Among the above-indicated connecting methods, soldering is used in many applications since it enables a large number of connecting portions to be joined together at a time at a relatively low temperature. FIG. 5($a$) is a cross-sectional view showing an electrode portion of a semiconductor device prior to soldering.

An electrode consisting of an alloy layer (hereinafter referred to as "Al layer") 2 having a thickness of 0.5 $\mu$m and containing aluminum as a major component, a nickel (Ni) layer 3 having a thickness of 0.5 $\mu$m, and a gold (Au) layer 4 having a thickness of 0.2 $\mu$m is formed on a semiconductor substrate 1 made of silicon (Si), by electron beam deposition or other method. The Ni layer 3 is used for soldering, and the Au layer 4 is provided for preventing oxidation of the electrode surface and improving wettability.

FIG. 5($b$) is an enlarged cross-sectional view showing the electrode portion after soldering. A terminal 6 is joined to the Ni layer 3 with a lead-tin solder 5 interposed therebetween. After actually using the semiconductor device thus obtained by soldering, it was found that part of its electrode suffered from considerable reduction in the joining strength.

FIG. 5($c$) is an enlarged cross-sectional view showing the electrode portion in which the considerable reduction in the joining strength was observed.

In the electrode portion of FIG. 5($c$), an aluminum-nickel (Al—Ni) intermetallic compound 7 developed or grew from the interface between the Al layer 2 and the Ni layer 3, down to the interface between the Al layer 2 and the Si substrate 1, and clearances 8 were formed between the Al—Ni intermetallic compound 7 and the Si substrate 1. Observing the electrode portion of FIG. 5($b$) more carefully, it was also found that an Al—Ni intermetallic compound 7 was formed between the Al layer 2 and the Ni layer 3.

Since the electrode is subjected to high temperatures in the range of 300 to 500° C. during lamination of the layers and soldering, and also under conditions of the use thereof, the Al—Ni intermetallic compound 7 grows from the interface between the Al layer 2 and the Ni layer 3, and the clearances 8 are formed probably because of volume changes (volume decrease) due to phase changes from the Al layer 2 and Ni layer 3 to the Al—Ni intermetallic compound 7. As a result, the joining strength between the terminal 6 and the Si substrate 1 is rapidly reduced.

In addition to the high temperature as described above, electrodes of semiconductor devices are generally exposed to other thermal stresses caused by, for example, heating of the Si substrate when Al layer or Ni layer is formed thereon, heat treatment for removing defects in the Si substrate through electron beam irradiation, heat treatment for removing water vapor adhering to the surface, abnormal high temperatures due to temperature variations within the device during the above heat treatments, abnormal high temperatures due to temperature variations among lots during the heat treatment processes, and heat generated it local portions of the semiconductor device due to concentration of current during the use of the device.

SUMMARY OF THE INVENTION

It is therefore an objet of the present invention to provide a semiconductor device having a laminated metal layer in which a metal layer containing Al as a major component and a metal layer containing Ni as a major component are laminated in contact with each other, which device assures high reliability for a long period of time.

To accomplish the above object, the present invention provides a semiconductor device comprising: a semiconductor substrate; and a laminated metal layer formed in the semiconductor substrate, the laminated metal layer comprising a first metal layer containing aluminum as a major component and a second metal layer containing nickel as a major component, which arc laminated in contact with each other, wherein the ratio ($t_{Al}/t_{Ni}$) of the thickness ($t_{A1}$) of the first metal layer containing aluminum as a major component to the thickness ($t_{Ni}$) of the second metal layer containing nickel as a major component is at least 5.

When the electrode of the semiconductor device in the form of the laminated metal layer is exposed to high temperature, an Al—Ni intermetallic compound grows at a boundary or interface between the metal layer whose main component is Al and the metal layer whose main component is Ni, which ale laminated on each other to provide the electrode. The Al—Ni intermetallic compound is mainly NiAl$_3$. If the ratio ($t_{Al}/t_{Ni}$) of the thicknesses of these metal layers is controlled to 5 or larger, the Al—Ni intermetallic compound does not reach the interface between the substrate as a base and the Al layer. Here, problems due to the formation of the Al—Ni intermetallic compound arise where the metal layers have crystal lattices of Al and Ni as main lattices, for example, where the metal layers contain at least 50% of Al atoms and Ni atoms, respectively. Although an Al—Ni intermetallic compound may be formed even with the smaller contents, such an intermetallic compound has a small influence on the resulting device.

In one form of the invention, a solder is deposited on the second metal layer containing nickel as a major component.

If the metal layer whose main component is Ni is soldered to an external component, tile metal layers of Ni and Al are subjected to heat treatment, and an Al—Ni intermetallic compound is likely to be Honed. In this case, too, the problem of reduced strength can be avoided by controlling the thickness ratio of these layers to 5 or larger as described above.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

The processes and results of experiments based on which the present invention was developed will be now described.

Experiment 1

Figure 1:
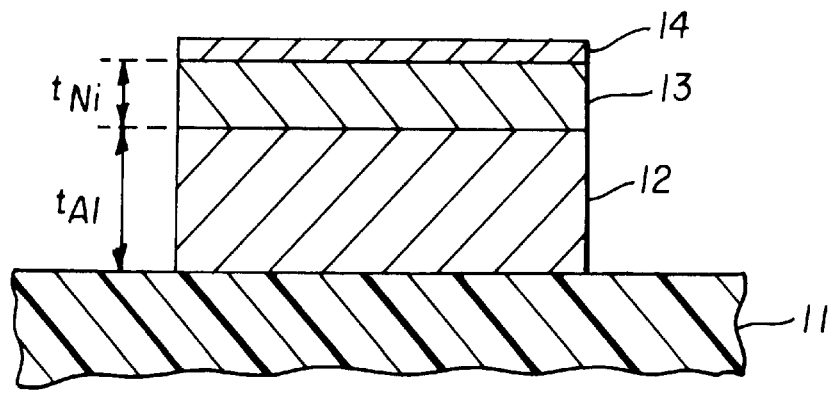
FIG. 1 is a cross-sectional view showing an electrode portion of a semiconductor device according to one embodiment of the present invention.

FIG. 1 is an enlarged cross-sectional view showing an electrode portion of a semiconductor device used in Experiment 1. Al layer 12 having a thickness of 3 μm, Ni layer 13 having a thickness of 0.5 μm, and Au layer 14 having a thickness of 0.2 μm are laminated in this order on Si substrate 11. After all of these metal layers are successively formed by electron beam deposition, the Au layer 14 is subjected to wet etching with an aqueous solution of a iodine compound, and the Ni layer 13 and Al layer 12 are successively subjected to wet etching, using an aqueous solution of a mixture of phosphoric acid, nitric acid and acetic acid, so as to form the laminate into the shape of electrode.

Figure 5A:
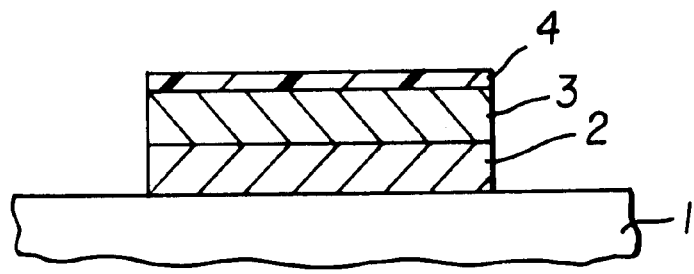
FIG. 5(a) is a cross-sectional view showing an electrode portion of a conventional semiconductor device.
Figure 5B:
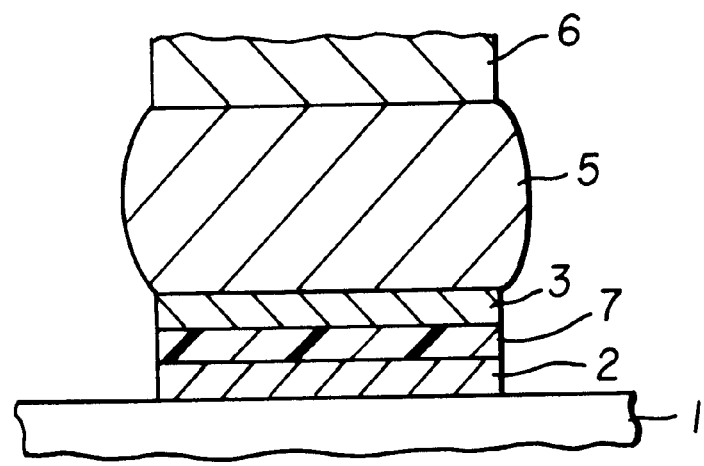
FIG. 5(b) is a cross-sectional view showing the electrode portion after soldering.
Figure 5C:
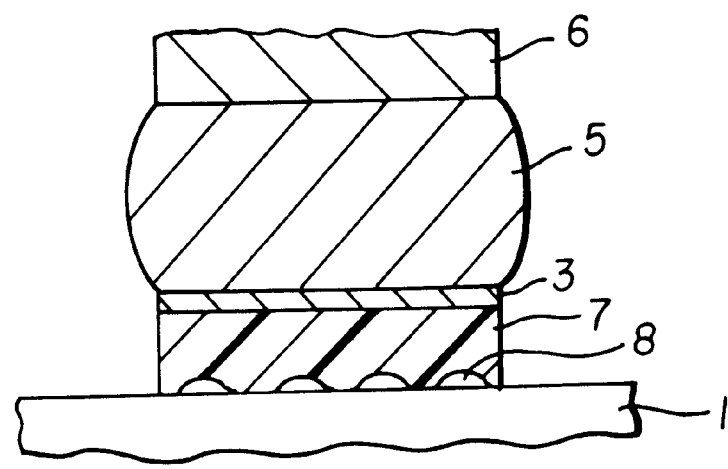
FIG. 5(c) is a cross-sectional view showing the electrode portion after long-term use.

The electrode portion as shown in FIG. 5(a) is different from that of the known semiconductor device in that the thickness of the Al layer 12 is increased to 3 μm, which is five times or more as large as that of the Ni layer 13.

Figure 2:
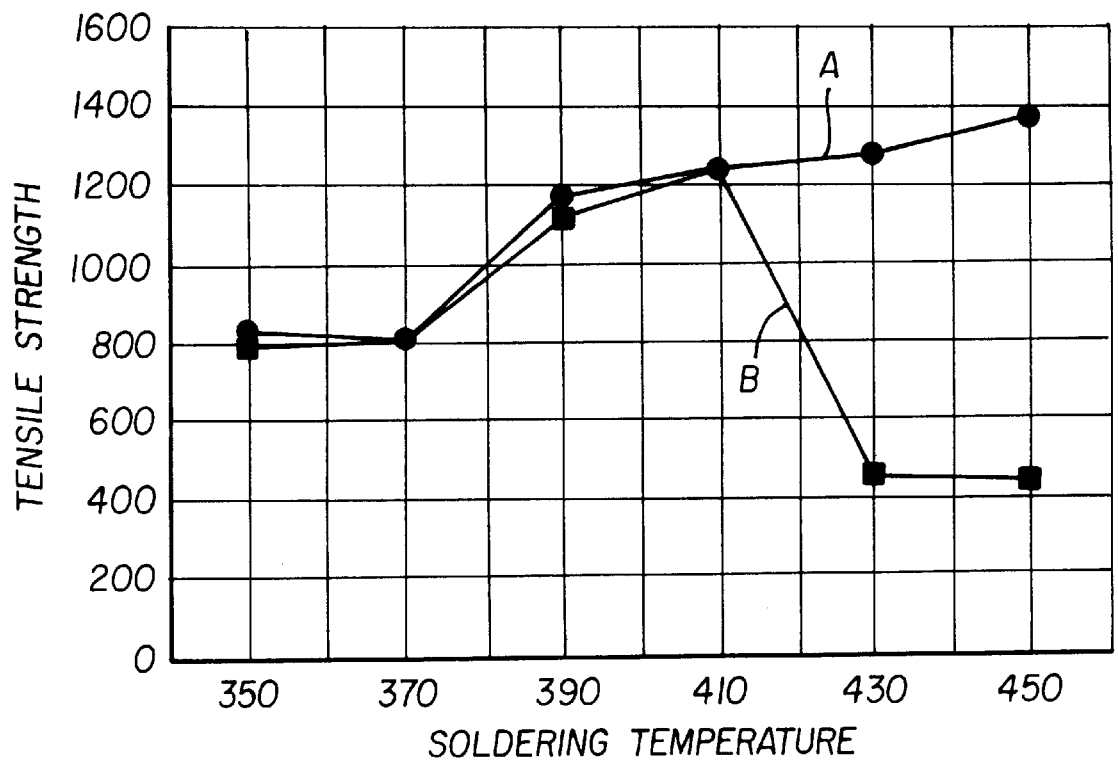
FIG. 2 is a graph showing the relationship between the soldering temperature and the tensile strength as observed in Experiment 1.

FIG. 2 is a graph showing the relationship between the soldering temperature and the tensile strength of the electrode of the semiconductor device thus obtained, wherein the horizontal axis indicates the maximum temperature of a tunnel furnace in which soldering was carried out, and the vertical axis indicates the tensile strength. A solder containing 95% of lead, tin and silver was used for soldering, and the joined area was about 1.3 mm².

In FIG. 2, curve A indicates results obtained with respect to the electrode of the semiconductor device according to the present invention, and curve B indicates results obtained with respect to the electrode of the known semiconductor device of FIG. 5(a) as a comparative example. As is apparent from the graph, the tensile strength is suddenly reduced in the comparative example (B) as the soldering temperature becomes higher than 410° C., whereas high tensile strength is obtained in the present embodiment (A) even when the soldering temperature is increased to 450° C.

Experiment 2

Figure 3:
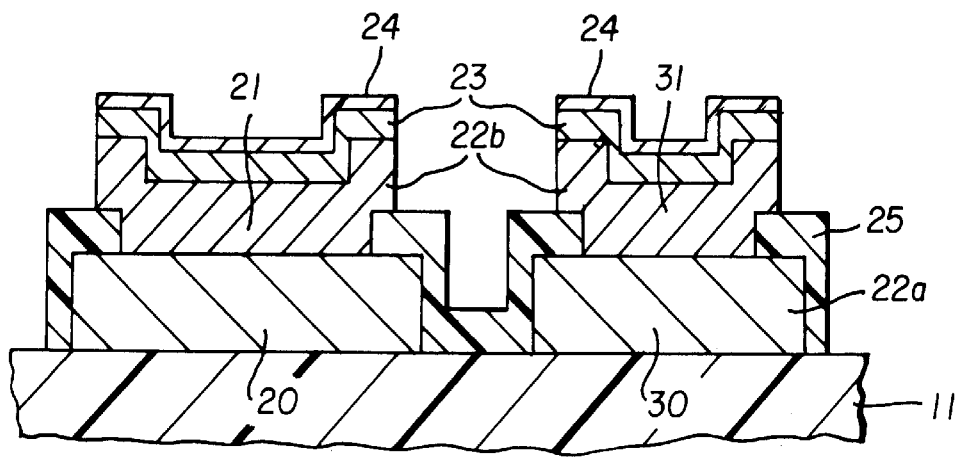
FIG. 3 is a cross-sectional view showing an electrode portion of a semiconductor device according to another embodiment of the present invention.

FIG. 3 is an enlarged cross-sectional view showing an electrode portion of a semiconductor device used in Experiment 2. Al alloy layer 22a having a thickness of 5 μm and containing 1% of Si, Al layer 22b having a thickness of 2.8 μm, and Ni layer 23 having a thickness of 0.4 μm are laminated in this order on an Si substrate 21.

The Al alloy layer 22a, after formed by sputtering, is subjected to wet etching using an aqueous solution of a mixture of phosphoric acid, nitric acid and acetic acid, so as to form an emitter electrode 20 and a gate electrode 30. Subsequently, a 1 μm-thickness nitride film ($Si_3N_4$ film) 25 is formed by CVD method, using mono-silane ($SiH_4$) gas and ammonia ($NH_3$) gas, and then subjected to dry etching using mixed gas of carbon tetrafluoride ($CF_4$) gas and oxygen ($O_2$), thereby to form openings 21, 31 through which the emitter electrode 20 and the gate electrode 30 are respectively exposed to the outside. After the Al layer 22b having a thickness of 2.8 μm, Ni layer 23 having a thickness of 0.4 μm and Au layer 24 having a thickness of 0.2 μm are successively formed by electron beam deposition, the Au layer 24 is subjected to wet etching with an aqueous solution of a iodine compound, and the Ni layer 23 and Al layer 22b are successively subjected to wet etching, using an aqueous solution ol a mixture of phosphoric acid, nitric acid and acetic acid, so as to form the laminate into the shape of the electrodes.

The emitter electrode portion and gate electrode portion that have experienced a heat treatment process of 430° C. showed a tensile strength of 1200 g, which is sufficiently high.

In a similar manner, some specimens with Al layers 22b having various thicknesses in the range of 0.4 to 2.4 μm were fabricated, and the tensile strength of the emitter electrode portion and gate electrode portion of each specimen after a heat treatment process of 430° C. was measured.

Figure 4:
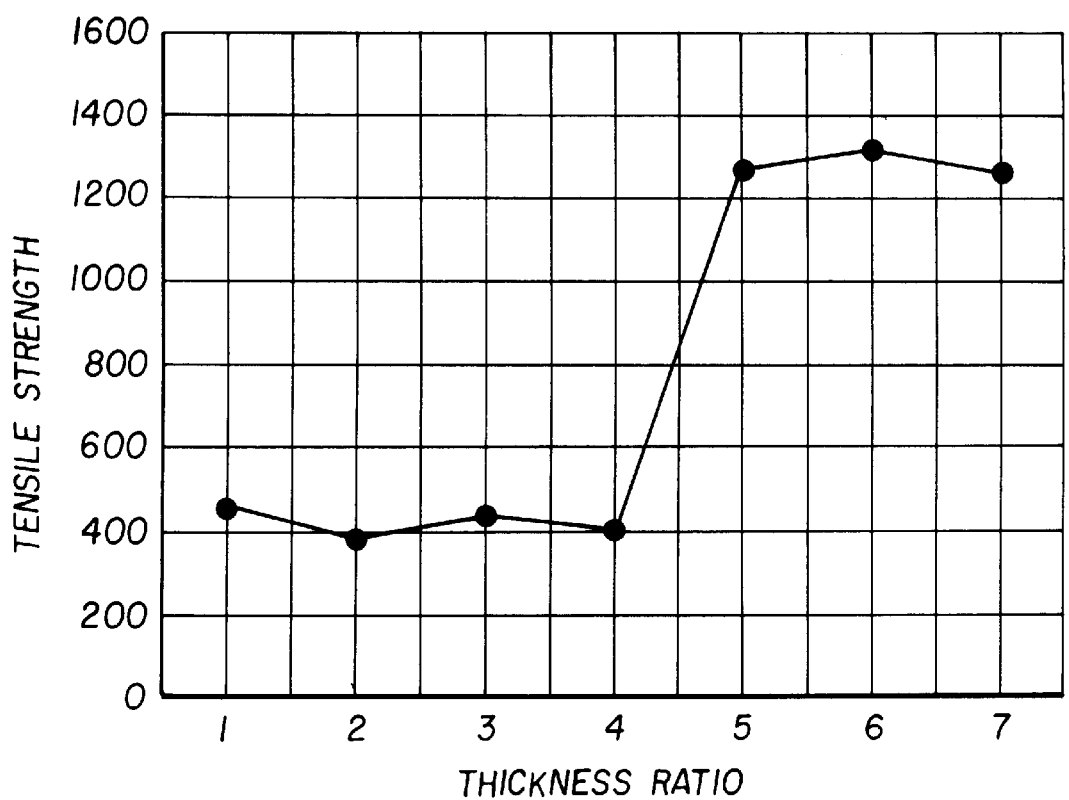
FIG. 4 is a graph showing the relationship between the ratio of the thickness of an Al layer to that of a Ni layer and the tensile strength as observed in Experiment 2.

FIG. 4 is a graph showing the relationship between the ratio ($t_{Al}/t_{Ni}$) of the Al thickness ($t_{Al}$) to the Ni thickness ($t_{Ni}$) and the tensile strength, after a heat treatment process was carried out at 430° C. In FIG. 4, the horizontal axis indicates the ratio ($t_{Al}/t_{Ni}$) of the Al thickness ($t_{Al}$) to the Ni thickness ($t_{Ni}$), and the vertical axis indicates the tensile strength, where the joining area was about 1.3 mm².

It will be understood from FIG. 4 that the thickness ratio ($t_{Al}/t_{Ni}$) is extremely important, and that if the thickness ratio ($t_{Al}/t_{Ni}$) is equal to or larger than 5, the resulting electrode has sufficiently high tensile strength even after it is subjected to heat treatment of 430° C.

According to the phase diaphragm of Al—Ni system, $NiAl_3$ is known as a type of Al-rich Al—Ni intermetallic compound. Namely, the amount of Al atoms consumed for forming this compound is three times as much as that of Ni atoms. The number of Al atoms per cm³ is $6.02 \times 10^{22}$, and that of Ni atoms is $9.02 \times 10^{22}$. Assuming that the filling factor of the deposited film is the same with respect to the Al layer and Ni layer, the thickness of the Al layer containing the number of Al atoms three times larger than that of the Ni atoms corresponds to about 4.5 times as large as that of the Ni layer.

Accordingly, if Al is contained in the above amount or larger, namely, if the thickness ratio ($t_{Al}/t_{Ni}$) is 5 or larger, part of the Al layer 22b remains without forming the Al/Ni compound. It is experimentally confirmed that the joining strength is hardly reduced if part of the Al layer 22b that does not form the Al/Ni compound remains.

In specimens in which the thickness ratio ($t_{Al}/t_{Ni}$) is 4 or smaller, on the other hand, clearances were observed at the boundary between the Al alloy layer 22a and the Al layer 22b. It is thus found important to control the thickness of the Al layer directly contacting with the Ni layer to a suitable value.

Although soldering was employed for joining the Al layer and the Ni layer together in the experiments as described above, which is because heat treatment during soldering significantly affects the state of the interface between these layers, other joining methods than soldering may be employed. If heat treatment is conduced while the Al layer and the Ni layer are in contact with each other, reaction between Al and Ni occurs, and an Al—Ni intermetallic compound is developed over a certain period of time.

The present invention may also be applied to semiconductor devices having semiconductor substrates, such as Si or gallium arsenide, or insulating substrates, such as alumina or silicon nitride. Also, the metal layer containing Al as a major component may be made solely of Al, or formed by adding Si or copper (Cu) to Al, and the metal layer containing Ni as a major component may be made solely of Ni, or formed by adding phosphorous (P) or boron (B) to Ni. A layer of Au or silver (Ag) may be provided on the top of the laminated electrode, in order to improve the wettability with the solder. The metal layers may be formed by sputtering, electron beam deposition, CVD method, plating, or any other method.

As described above, the semiconductor device includes a laminated metal layer formed on a semiconductor substrate, and the laminated metal layer includes a metal layer containing aluminum as a major component and a metal layer containing nickel as a major component, which are laminated in contact with each other. According to the present invention, the ratio ($t_{Al}/t_{Ni}$) of the thickness ($t_{Al}$) of the metal layer containing aluminum as a major component to that ($t_{Ni}$) of the metal layer containing nickel as a major component is controlled to 5 or larger. With the thickness ratio thus controlled, the resulting semiconductor device exhibits a sufficiently high strength and high reliability, even if an Al—Ni intermetallic compound is formed when the electrode is exposed to high temperature.

What is claimed is:

1. A semiconductor device comprising:

a semiconductor substrate; and a laminated metal layer formed in said semiconductor substrate, said laminated metal layer comprising a first metal layer containing aluminum as a major component and a second metal layer containing nickel as a major component, which are laminated in contact with each other, wherein the ratio ($t_{Al}/t_{Ni}$) of the thickness ($t_{Al}$) of the first metal layer containing aluminum as a major component to the thickness ($t_{Ni}$) of the second metal layer containing nickel as a major component is at least 5.

2. A semiconductor device according to claim 1, wherein a solder is deposited on the second metal layer containing nickel as a major component.

* * * * *

UNITED STATES PATENT AND TRADEMARK OFFICE
CERTIFICATE OF CORRECTION

PATENT NO : 6,191,485 B1
DATED : February 20, 2001
INVENTOR(S): Tomoyuki KAWASHIMA et al.

It is certified that error appears in the above-identified patent and that said Letters Patent are hereby corrected as shown below:

<u>ON THE TITLE PAGE</u>
Item [73] Assignee

Please delete "Electronic" and insert --Electric--.

Signed and Sealed this

Twenty-ninth Day of May, 2001

Attest:

NICHOLAS P. GODICI

Attesting Officer     *Acting Director of the United States Patent and Trademark Office*